(12) United States Patent
Rossi et al.

(10) Patent No.: US 7,855,748 B2
(45) Date of Patent: Dec. 21, 2010

(54) REFERENCE VOLTAGE GENERATION IN IMAGING SENSORS

(75) Inventors: Giuseppe Rossi, Los Angeles, CA (US); Laurent Blanquart, Westlake Village, CA (US); Ying Huang, Newbury Park, CA (US)

(73) Assignee: AltaSens, Inc., Westlake Village, CA (US)

( * ) Notice: Subject to any disclaimer, the term of this patent is extended or adjusted under 35 U.S.C. 154(b) by 466 days.

(21) Appl. No.: 11/949,542

(22) Filed: Dec. 3, 2007

(65) Prior Publication Data

US 2009/0141156 A1  Jun. 4, 2009

(51) Int. Cl.
*H04N 5/225* (2006.01)
(52) U.S. Cl. .................... 348/372; 348/241; 327/539
(58) Field of Classification Search .............. None
See application file for complete search history.

(56) References Cited

U.S. PATENT DOCUMENTS

| | | | |
|---|---|---|---|
| 4,164,791 A | | 8/1979 | Homma |
| 5,280,200 A | | 1/1994 | Tarng |
| 5,399,960 A | | 3/1995 | Gross |
| 6,160,391 A | | 12/2000 | Banba |
| 6,348,681 B1 | * | 2/2002 | Kindt et al. ............ 250/208.1 |
| 6,501,305 B2 | * | 12/2002 | Rincon-Mora et al. ...... 327/108 |
| 7,132,821 B2 | | 11/2006 | Camara et al. |
| 2003/0128147 A1 | * | 7/2003 | Huang et al. ............. 341/155 |
| 2005/0195304 A1 | * | 9/2005 | Nitta et al. ............... 348/308 |
| 2005/0253644 A1 | * | 11/2005 | Crippa et al. ............. 327/541 |
| 2005/0285954 A1 | * | 12/2005 | Rossi et al. .............. 348/243 |
| 2006/0119501 A1 | * | 6/2006 | Pereira et al. ............ 341/172 |
| 2006/0188243 A1 | * | 8/2006 | Jung ..................... 396/100 |
| 2006/0290550 A1 | | 12/2006 | Lee |
| 2006/0291008 A1 | * | 12/2006 | Tewinkle et al. .......... 358/482 |

FOREIGN PATENT DOCUMENTS

EP  0531101 A2  3/1993

(Continued)

OTHER PUBLICATIONS

Xu et al., "A High Performance CMOS Band Gap Reference Circuit Design," Proc. Of IEEE International Workshop on VLSI Design and Video Technology, 2005.*

(Continued)

*Primary Examiner*—Lin Ye
*Assistant Examiner*—Dennis Hogue
(74) *Attorney, Agent, or Firm*—Turocy & Watson, LLP

(57) ABSTRACT

The claimed subject matter provides systems and/or methods that facilitate generating and/or maintaining low noise reference voltages for CMOS imaging System-on-Chip (iSoC) sensors. A primary reference voltage can be generated utilizing a low noise bandgap. Further, the primary reference voltage can be filtered via a low pass filter. The filtered, primary reference voltage can thereafter be distributed to a plurality of isolated domains. Each of the isolated domains can generate an independent set of reference voltages based upon the filtered, primary reference voltage. Moreover, subsets of these reference voltages can be employed by programmable digital to analog converters (DACs). Each of the reference voltages can be isolated from switching noise and/or clock glitches generated within each domain. Further, each DAC output can be buffered to have adequately low impedance with appropriate drive capability and requisite signal swing.

18 Claims, 9 Drawing Sheets

FOREIGN PATENT DOCUMENTS

| EP | 0531101 A3 | 3/1993 |
| EP | 1783778 A | 5/2007 |
| GB | 2362277 A | 11/2001 |

OTHER PUBLICATIONS

Chen, et al., "PASIC: a smart sensor for computer vision." Proceedings of 10th International Conference on Pattern Recognition, Jun. 16-21, 1990, vol. 2, pp. 286-291.

Widlar, "An exact expression for the thermal variation of the emitter base voltage of bi-polar transistors." Proceedings of the IEEE, Jan. 1967, vol. 55, issue 1, pp. 96-97.

International Search Report for PCT Application No. PCT/US2008/085420, mailed Mar. 24, 2009, 16 pages.

Wendan Xu, et al. "A High-Performance CMOS Brand-Gap Reference Circuit Design." Proceedings of 2005 IEEE International Workshop on VLSI Design and Video Technology, 2005. Suzhou, China, May 28-30, 2005, Piscataway, NJ, USA, XP010833292. ISBN: 978-0-7803-9005-8. http://ieeexplore.ieee.org/Xplore/login.jsp?url=http%3A%2F%2Fieeexplore.ieee.org%2Fiel5%2F10054%2F32247%2F01504457.pdf%3Farnumber%3D1504457&authDecision=-203. Last accessed May 19, 2009, 4 pages.

* cited by examiner

REFERENCE VOLTAGE GENERATION IN IMAGING SENSORS

BACKGROUND

Recent technological advances have led to complementary metal-oxide-semiconductor (CMOS) sensor imagers being leveraged by cameras, video systems, and the like. CMOS sensor imagers can include an integrated circuit with an array of pixel sensors, each of which can comprise a photodetector. Moreover, a CMOS sensor imager can be incorporated into a System-on-Chip (SoC). As such, the SoC can integrate various components (e.g., analog, digital, . . . ) associated with imaging into a common integrated circuit. For instance, the SoC can include a microprocessor, microcontroller, or digital signal processor (DSP) core, memory, analog interfaces (e.g. analog to digital converters, digital to analog converters), and so forth.

Visible imaging systems implemented using CMOS imaging sensors can reduce costs, power consumption, and noise while improving resolution. For instance, cameras can use CMOS imaging System-on-Chip (iSoC) sensors that efficiently marry low-noise image detection and signal processing with multiple supporting blocks that can provide timing control, clock drivers, reference voltages, analog to digital conversion, digital to analog conversion and key signal processing elements. High-performance video cameras can thereby be assembled using a single CMOS integrated circuit supported by few components including a lens and a battery, for instance. Accordingly, by leveraging iSoC sensors, camera size can be decreased and battery life can be increased. Also, dual-use cameras have hence emerged that alternately produce high-resolution still images or high definition (HD) video.

The advantages offered by System-on-Chip integration in CMOS visible imagers for emerging camera products have spurred effort to further improve active-pixel sensor (APS) devices. Active-pixel sensors with on-chip analog and/or digital signal processing provide temporal noise superior to scientific-grade video systems using charge-coupled device (CCD) sensors. Sophisticated iSoCs, on the other hand, are vulnerable to noise pickup inside the sensor that can increase random and fixed pattern noise. Moreover, contrasting clocking frequencies (e.g., µs to tens of ns), capacitive loads (e.g. from a few pF to a few nF), bandwidths (e.g., few MHz to GHz), and slew rates pose a significant challenge for designing a comprehensive low noise reference generator. Another consideration for maximizing image quality is the need to mitigate spurious noise events that potentially can cause cross-talk between reference voltage components. Accordingly, conventional voltage generation techniques oftentimes fail to deliver low noise reference voltages on large integrated circuits such as, for example, when the integrated circuits are complex iSoCs.

SUMMARY

The following presents a simplified summary in order to provide a basic understanding of some aspects described herein. This summary is not an extensive overview of the claimed subject matter. It is intended to neither identify key or critical elements of the claimed subject matter nor delineate the scope thereof. Its sole purpose is to present some concepts in a simplified form as a prelude to the more detailed description that is presented later.

The claimed subject matter relates to systems and/or methods that facilitate generating and/or maintaining low noise reference voltages for CMOS imaging System-on-Chip (iSoC) sensors. A primary reference voltage can be generated utilizing a low noise bandgap. Further, the primary reference voltage can be filtered via a low pass filter. The filtered, primary reference voltage can thereafter be distributed to a plurality of isolated domains. Each of the isolated domains can generate an independent set of reference voltages based upon the filtered, primary reference voltage. Moreover, subsets of these reference voltages can be employed by programmable digital to analog converters (DACs). Each of the reference voltages can be isolated from switching noise and/or clock glitches generated within each domain. Further, each DAC output can be buffered to have adequately low impedance with appropriate drive capability and requisite signal swing.

According to various aspects, each of the domains can serve circuits that support similar activities and/or frequencies of activities. For example, three domains can be utilized such that high frequency, intermediate frequency and low frequency activities can be separated from each other. Following this example, switching effects within each of the three domains can be isolated. Thus, for instance, high frequency circuits can be separated from intermediate and low frequency circuits (e.g., high frequency noise yielded from the high frequency circuits can be isolated from the intermediate and low frequency circuits).

The following description and the annexed drawings set forth in detail certain illustrative aspects of the claimed subject matter. These aspects are indicative, however, of but a few of the various ways in which the principles of such matter may be employed and the claimed subject matter is intended to include all such aspects and their equivalents. Other advantages and novel features will become apparent from the following detailed description when considered in conjunction with the drawings.

DETAILED DESCRIPTION

Figure 1:
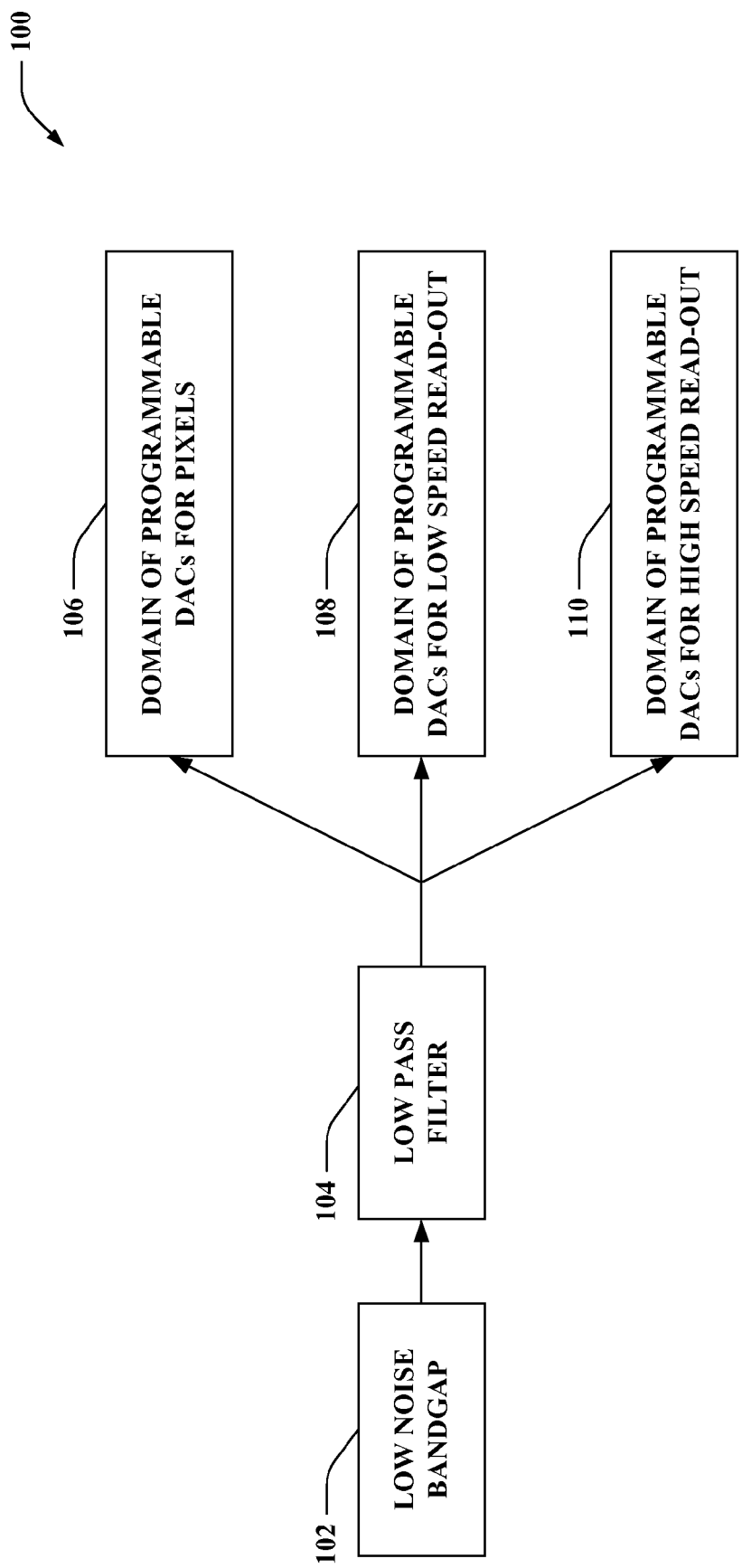
FIG. 1 illustrates a block diagram of an example system that generates and/or maintains low noise reference voltages for a CMOS iSoC sensor.

The claimed subject matter is described with reference to the drawings, wherein like reference numerals are used to refer to like elements throughout. In the following description, for purposes of explanation, numerous specific details are set forth in order to provide a thorough understanding of the subject innovation. It may be evident, however, that the claimed subject matter may be practiced without these specific details. In other instances, well-known structures and devices are shown in block diagram form in order to facilitate describing the subject innovation.

As utilized herein, terms "component," "system," and the like are intended to refer to a computer-related entity, either hardware, software (e.g., in execution), and/or firmware. For example, a component can be a process running on a processor, a processor, an object, an executable, a program, and/or a computer. By way of illustration, both an application running on a server and the server can be a component. One or more components can reside within a process and a component can be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips, . . . ), optical disks (e.g., compact disk (CD), digital versatile disk (DVD), . . . ), smart cards, and flash memory devices (e.g., card, stick, key drive, . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope or spirit of the claimed subject matter. Moreover, the word "exemplary" is used herein to mean serving as an example, instance, or illustration. Any aspect or design described herein as "exemplary" is not necessarily to be construed as preferred or advantageous over other aspects or designs.

With reference to FIG. 1, illustrated is a system 100 that generates and/or maintains low noise reference voltages for a CMOS iSoC sensor. The system 100 can be a voltage generation system that yields a low noise output and employs low power while mitigating cross-talk. CMOS iSoC sensors can utilize several voltages for various components (e.g. analog to digital converters (ADCs), amplifiers, pixels, . . . ) integrated therein. Moreover, each of the components can be associated with disparate types of loads; thus, the loads can be associated with differing clocking frequencies, capacitive loads, bandwidths, slew rates, noise requirements, and the like. Accordingly, the system 100 can provide reference voltages to these components integrated within a common CMOS iSoC sensor while mitigating cross-talk between channels. For instance, the system 100 can isolate the signal paths from the voltage generator to the various application points (e.g., paths to components can be independent of each other).

More particularly, the system 100 includes a low noise bandgap 102 and a low pass filter 104. The low noise bandgap 102 can generate a bandgap voltage, which can be a primary reference employed by the CMOS iSoC sensor. The bandgap voltage generated by the low noise bandgap 102 can be temperature, process, and voltage independent. The bandgap voltage can further be filtered by the low pass filter 104. The filtered output from the low pass filter 104 can be a stable bandgap voltage.

The filtered bandgap voltage yielded by the low pass filter 104 can thereafter be distributed via a star network configuration (e.g., the filtered bandgap voltage can be distributed to multiple iSoC components). The filtered bandgap voltage can be supplied to three iSoC sensor domains; namely, the output from the low pass filter 104 can be distributed to a domain of programmable digital to analog converters (DACs) for pixels 106, a domain of programmable DACs for low speed read-out 108, and a domain of programmable DACs for high speed read-out 110. It is to be appreciated, however, that the claimed subject matter is not limited to distributing the filtered bandgap voltage to three domains as shown; rather, reference voltages can be distributed to domains other than those that support operations for the pixel, column buffer, high-speed amplifier, and digitizer. The distributed topology utilized in connection with the system 100 can mitigate loading effects for the various voltage references provided by the voltage regulator and can isolate noise pickup from feeding back into the distributed voltage references.

Each of the domains 106-110 can serve circuits that support similar activities and/or frequencies of activities. The domain of programmable DACs for pixels 106 can serve pixels in the CMOS sensor. Moreover, the frequencies supported in the domain 106 can be less than 1 MHz. Further, the domain of programmable DACs for low speed read-out 108 can be associated with front end read-outs of the pixels, where the frequencies can be in the range of 1 MHz to 5 MHz. Additionally, the domain of programmable DACs for high speed read-out 110 can be utilized for high voltage, high frequency, high clock rate activities (e.g. greater than 10 MHz, . . . ). For example, the domain of programmable DACs for high speed read-out 110 can provide references for high speed ADCs that operate at 40 MHz; however, it is to be appreciated that the claimed subject matter is not so limited.

The reference block supplying reference voltages for each of the domains 106-110 can be optimized to support specific ranges of bandwidth requirements. Moreover, the bandgap voltage from the low pass filter 104 can be decoupled to remove noise picked up after initial generation. Switching effects within each reference sub-generator domain 106-110 can also be isolated to each domain 106-110. References generated for high-speed circuits, such as the programmable gain amplifier (PGA) and analog to digital converts (ADCs), can thus be isolated from those references supporting lower speed functions such as a pixel, column buffer and line driver amplifier. Moreover, line driver references can be isolated from column buffer references, which can also be isolated from low-bandwidth pixel references. Voltage taps shared among several programmable DACs can be decoupled using suitable decoupling capacitors at each DAC input. Locating the decoupling capacitors at the input of the DAC as opposed to the output of the voltage regulator can minimize conductor inductance and mitigate undesirable parasitic issues including supply resonance. Isolation between each of the domains 106-110 can be further enhanced, for example, by implementing time based multiplexing techniques related to local sampling of references.

Separation of the programmable DACs into disparate domains 106-110 enables kick-back noise to be reduced. Kick-back noise can result from switching activity. More particularly, conventional techniques oftentimes encounter injection of high frequency switching noise back upstream into a signal chain (e.g., the high frequency noise can bypass the bandwidth of amplifiers). Further, since circuits that support differing activities and/or employ non-similar bandwidth requirements are typically connected to the same reference in conventional implementations, activities of a high speed circuit commonly cause artifacts to be seen in low speed circuits, for example. In contrast, the system 100 isolates such circuits into differing domains 106-110, and thus, mitigates crosstalk, artifacts, and the like.

Figure 2:
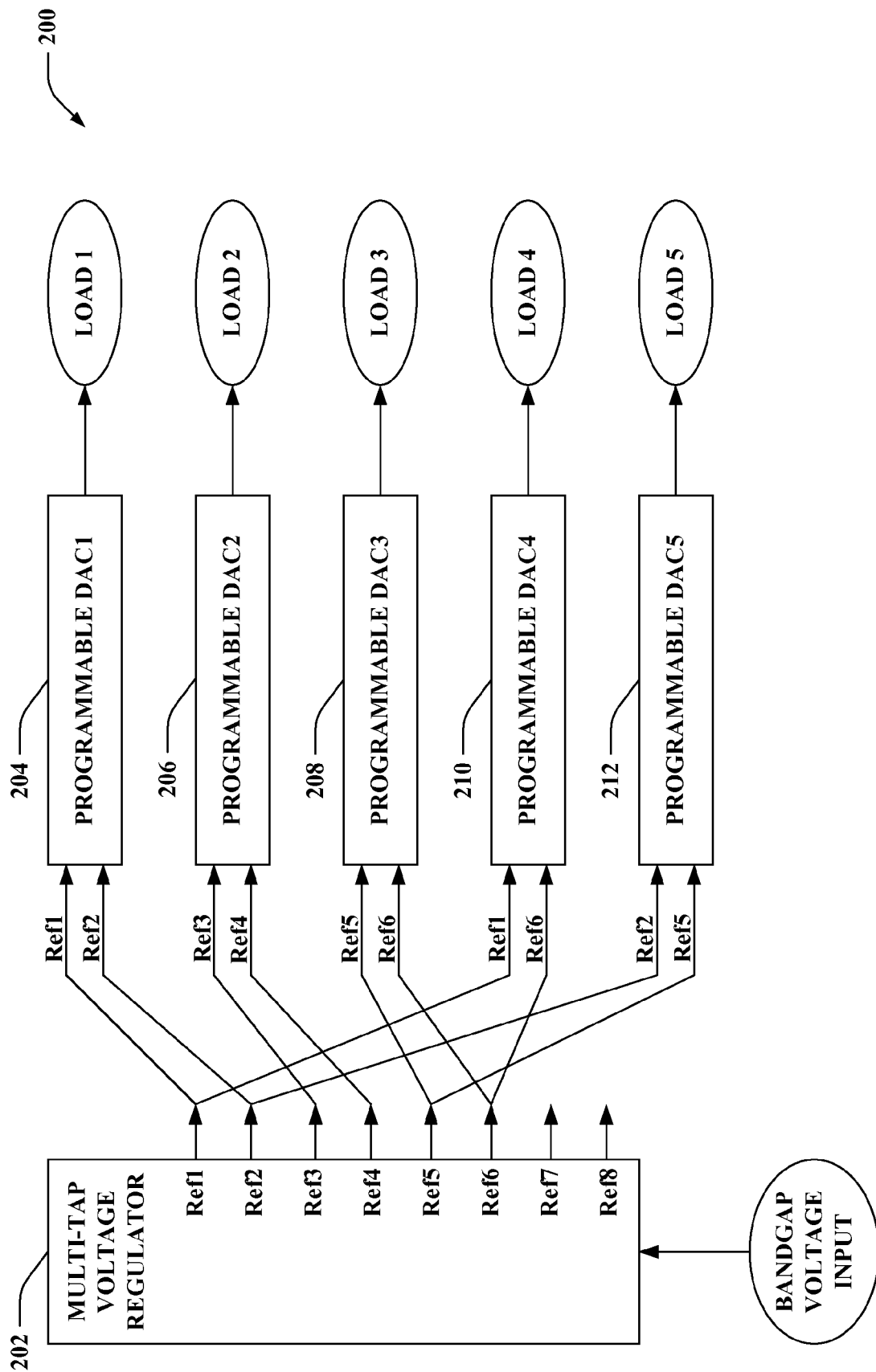
FIG. 2 illustrates a block diagram of an example system that generates reference voltages within a particular domain for a CMOS iSoC sensor.

Now turning to FIG. 2, illustrated is a system 200 that generates reference voltages within a particular domain for a CMOS iSoC sensor. The system 200 includes a multi-tap voltage regulator 202 and one or more programmable digital to analog converters (DACs). As shown, the system 200 comprises five programmable DACs (e.g., programmable DAC1 204, programmable DAC2 206, programmable DAC3 208, programmable DAC4 210, and programmable DAC5 212); however, it is to be appreciated that any number of programmable DACs can be supported (e.g., one programmable DAC, more than one programmable DAC, . . . ). The multi-tap voltage regulator 202 and programmable DACs 204-212 (and corresponding loads) relate to one domain out of a set of domains (e.g., the set of domains can include the domain of programmable DACs for pixels 106, the domain of programmable DACs for low speed read-out 108, and the domain of programmable DACs for high speed read-out 110); thus, disparate multi-tap voltage regulator(s) and respective programmable DACs (not shown) can be utilized for other domain(s).

The multi-tap voltage regulator 202 is an electrical regulator designed to generate and maintain a constant voltage level (or set of voltage levels). The multi-tap voltage regulator 202 utilizes a bandgap voltage input (e.g., power supply) to yield the voltage level(s). Further, the bandgap voltage input can be the output obtained from the low noise bandgap 102 and the low pass filter 104 of FIG. 1. Moreover, the multi-tap voltage regulator 202 can generate a set of equally distributed references (e.g., any number of references can be included in the set of references). Thus, according to an illustration, the multi-tap voltage regulator 202 can yield a set of references equally distributed between 0 and 3 volts, where the bandgap voltage input can be 3 volts; however, it is contemplated that any power supply voltage can be leveraged by the system 200.

Multiple voltage references are independently generated at each domain using the multi-tap voltage regulator 202 wherein the bandgap voltage is the absolute reference. The multiple taps of the voltage regulator 202 are supplied to the programmable DACs 204-212 with precision ranging from 4 bits to 12 bits, depending upon the specific requirements for each corresponding load. By establishing all reference voltages from the bandgap voltage, the multi-tap voltage regulator 202 is largely independent of process, voltage and temperature (PVT) variations. The multiple voltage references yielded by the multi-tap voltage regulator 202, for instance, can be produced using resistive dividers and current dividers. Moreover, multiple voltages can be supplied by the multi-tap voltage regulator 202. Further, common connection points for shared tap points (e.g., Ref1, Ref 2, . . . ) can be obtained through a star connection at the specific output of the multi-tap voltage regulator 202.

The programmable DACs 204-212 utilize voltage references generated by the multi-tap voltage regulator 202. Each programmable DAC 204-212 can employ two voltage references (e.g., the programmable DAC1 204 can utilize Ref1 and Ref2, . . . ) from the set of voltage references yielded by the multi-tap voltage regulator 202, for example; however, it is contemplated that any number of voltage references can be utilized by each of the programmable DACs 204-212. Further, each of the programmable DACs 204-212 can have a substantially similar precision, yet can output references within different ranges for the respective loads.

Figure 3:
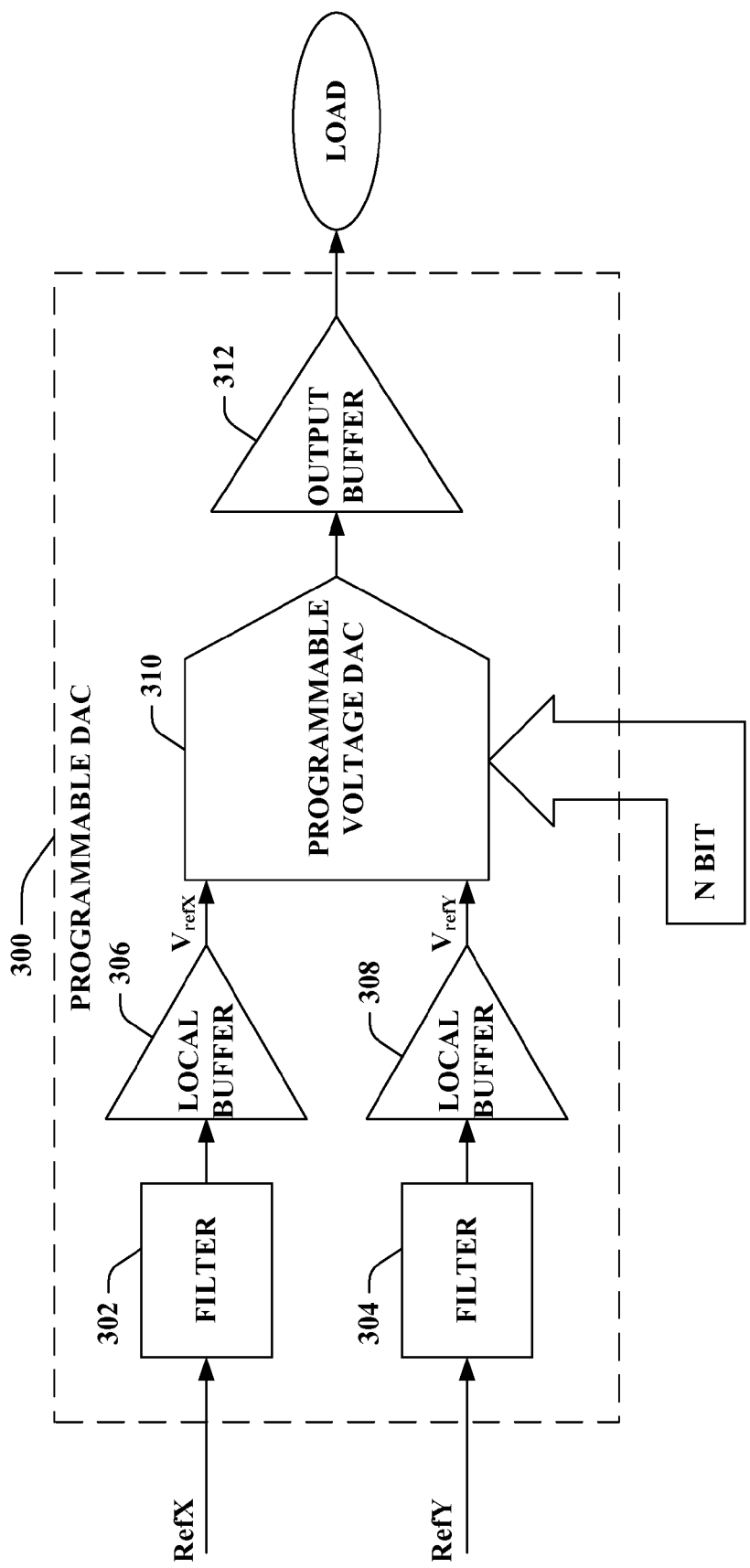
FIG. 3 illustrates a block diagram of an example programmable digital to analog converter (DAC) employed by a CMOS iSoC sensor.

Turning to FIG. 3, illustrated is a programmable digital to analog converter (DAC) 300 employed by a CMOS iSoC sensor. The programmable DAC 300 can be, for instance, one of the programmable DACs 204-212 of FIG. 2. The programmable DAC 300 can obtain two voltage references (e.g., RefX and RefY) as inputs; for instance, the voltage references can be received from the multi-tap voltage regulator 202 of FIG. 2. Moreover, the programmable DAC 300 can yield an analog output that can be leveraged by the corresponding load.

The programmable DAC 300 can include a filter 302 that filters RefX and a filter 304 that filters RefY. The filters 302-304 can be low pass filters; thus, the filters 302-304 can cut the frequency of signals passing upstream and downstream. For instance, high frequency noise included in the voltage references (e.g. RefX and RefY) traversing downstream towards the load can be attenuated. Moreover, the filters 302-304 can reduce kick-back noise that results from switching activity at the output; accordingly, high frequency noise injected from the node can be cut rather than allowing such noise to be provided to upstream references. For instance, the filters 302-304 can be passive filters that cut bandwidth seen by high frequency noise, and hence, can provide suppression of high frequency switching noise.

The filters 302-304 can further be coupled to respective local buffers (e.g., the filter 302 can be coupled with a local buffer 306 and the filter 304 can be coupled with a local buffer 308). The local buffers 306-308 can be buffer amplifiers that provide downstream isolation; moreover, the output from the local buffers 306-308 can be $V_{refX}$ and $V_{refY}$ respectively. Further, the filters 302-304 and the local buffers 306-308 can complement each other such that the filters 302-304 attenuate signals outside of the bandwidth in which the local buffers 306-308 operate (e.g., the local buffers 306-308 can behave like short circuits outside of such bandwidth).

A programmable voltage DAC 310 (e.g., N bit programmable voltage DAC) can be coupled to the local buffers 306-308. According to an illustration, an 8-bit programmable voltage DAC 310 can be utilized; however, the claimed subject matter is not so limited. The programmable DAC 310 can be further coupled to an output buffer 312 that yields an output utilized by the load. Accordingly, the output buffer 312 provides separation between the programmable voltage DAC 310 and the load (e.g., drivers at the output). The output buffer 312 can have a high slew rate and low impedance for current driving (e.g., the output buffer 312 can supply current requirements of the load). Thus, the output buffer 312 can provide driving capacities for the load while being separated from the programmable voltage DAC 310. In contrast, conventional techniques oftentimes employ programmable DACs to drive the load without such separation (e.g., such typical programmable DACs oftentimes lack sufficient load driving capabilities). Additionally, the output buffer 312 can attenuate feedback from the load.

Further, the load can be a capacitive load (e.g., switched capacitor). According to an illustration, characteristics of the capacitive load can be known prior to operation of the programmable DAC 300; however, the claimed subject matter is not so limited. Additionally, layout shielding can be provided by referring each voltage bit to an appropriate power supply. Thus, for example, an n-type output can be referred to ground and a p-type output can be referred to the positive analog supply Vdda.

Each reference voltage can be isolated from switching noise and clock glitches that can be propagating in either direction along each reference path. Isolation can be achieved by utilizing a passive filter (e.g., the filters 302-304) at each connection from the multi-tap voltage generator (e.g., the multi-tap voltage regulator 202 of FIG. 2) for each individual DAC reference (e.g., RefX, RefY). Further, the programmable DAC 300 employs a local voltage buffer amplifier 306-308 within each reference path. The passive filters 302-304 are designed to limit the signal path bandwidth to a frequency lower than the amplifier's 306-308 dominant poles to efficiently attenuate out-of-band noise. Each local buffer 306-308 thus actively controls the signal path for those frequencies within the band of the DAC amplifier.

According to an illustration, the programmable voltage DAC 310 can be implemented to yield an output voltage related to the two reference voltages, $V_{refX}$ and $V_{refY}$, for an 8-bit implementation according to the relationship:

$$V_{out,DAC} = V_{refX} + \frac{Bit\langle 7:0 \rangle}{255}(V_{refX} - V_{refY}).$$

Each programmable DAC (e.g., programmable DAC 300) is designed to have adequately low output impedance with appropriate drive capability for the required signal swing. This is implemented by decoupling the function of the programmable DAC 300 from the one of driving the generated DAC voltage to each output load. For instance, the output driver can be implemented either as a class A or class B amplifier. The role of the output buffer 312 can be critical whenever a switching capacitive load is selectively coupled to the programmable DAC output. In this case broadband switching noise might be coupled back to the DAC voltage as the impedance of the reference path for out-of-band noise increases significantly.

Voltage drop (IR drop) and electromigration in the lines supplying the various components are accommodated by sizing both the lines and the vias connecting the lines to insure that peak current can pass along each layer and from layer-to-layer where necessary. This design step can be both performed manually and via automated analysis to validate whether the predicted IR drop is sufficiently small to not affect performance independent of variations in process and operating temperature. The automated analysis involves checking place-and-route and post-layout verification with SPICE-based tools including HSIM and competing alternatives. A focus of the HSIM analysis is ground bounce because it affects the iSoCs global reference voltage as distributed by the star network. Ground noise, whether it is transmitted via substrate injection and leakage, or the ground network topology, dramatically reduces supply rejection ratio.

Figure 4:
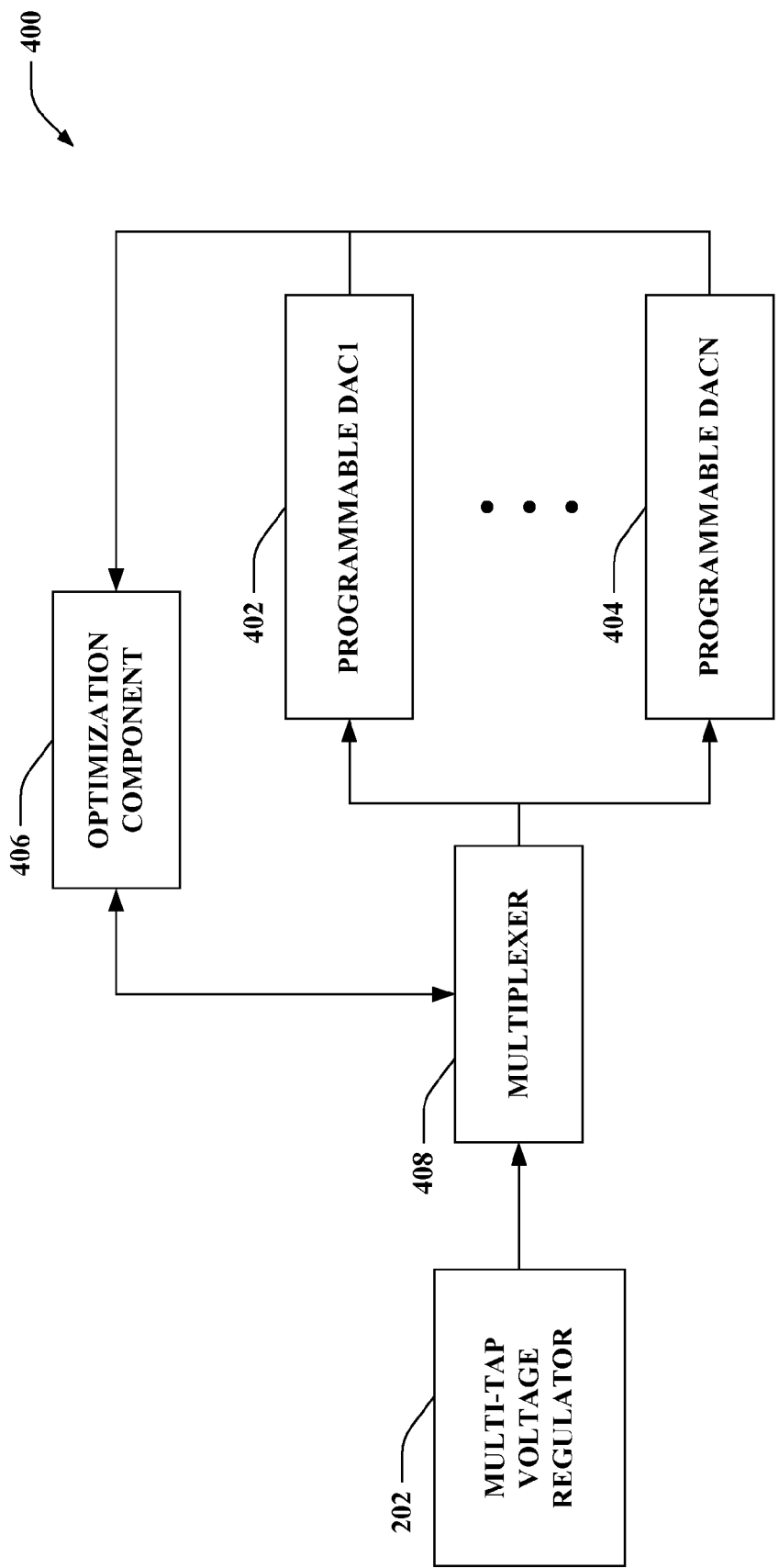
FIG. 4 illustrates a block diagram of an example system that dynamically combines reference voltages depending upon load for a CMOS iSoC sensor.

Referring to FIG. 4, illustrated is a system 400 that dynamically combines reference voltages depending upon load for a CMOS iSoC sensor. For instance, the system 400 can be dedicated for a particular domain (e.g., related to pixels, low speed read-out, high speed read-out, . . . ). Further, the CMOS iSoC sensor can include a plurality of systems similar to the system 400, where each of the systems can correspond to a distinct domain. The system 400 includes the multi-tap voltage regulator 202 that can generate a set of references (e.g., a set of reference voltages) for utilization by N programmable DACs (e.g., a programmable DAC1 402, . . . , a programmable DACN 404), where N can be any integer. The programmable DACs 402-404 can be substantially similar to the programmable DACs described above.

Moreover, the system 400 includes a multiplexer 406 that dynamically selects a subset of references from the set of references to provide to each of the programmable DACs 402-404. The multiplexer 406 can dynamically switch the references inputted to each of the programmable DACs 402-404 as a function of respective loads associated with the programmable DACs 402-404. Accordingly, the multiplexer 406 can replace hardwiring to allow for altering the subset of references employed by each of the programmable DACs 402-404.

The system 400 can additionally include an optimization component 408 that can obtain feedback from the programmable DACs 402-404 and/or the multiplexer 406 and thereafter adjust operation of the multiplexer 406. The feedback can relate to characteristics of the loads associated with each of the programmable DACs 402-404, kick-back noise injected upstream, and the like. Utilization of the optimization component 408 in conjunction with the multiplexer 406 enables previously unknown loads and/or time varying loads to be driven by the programmable DACs 402-404.

Figure 5:
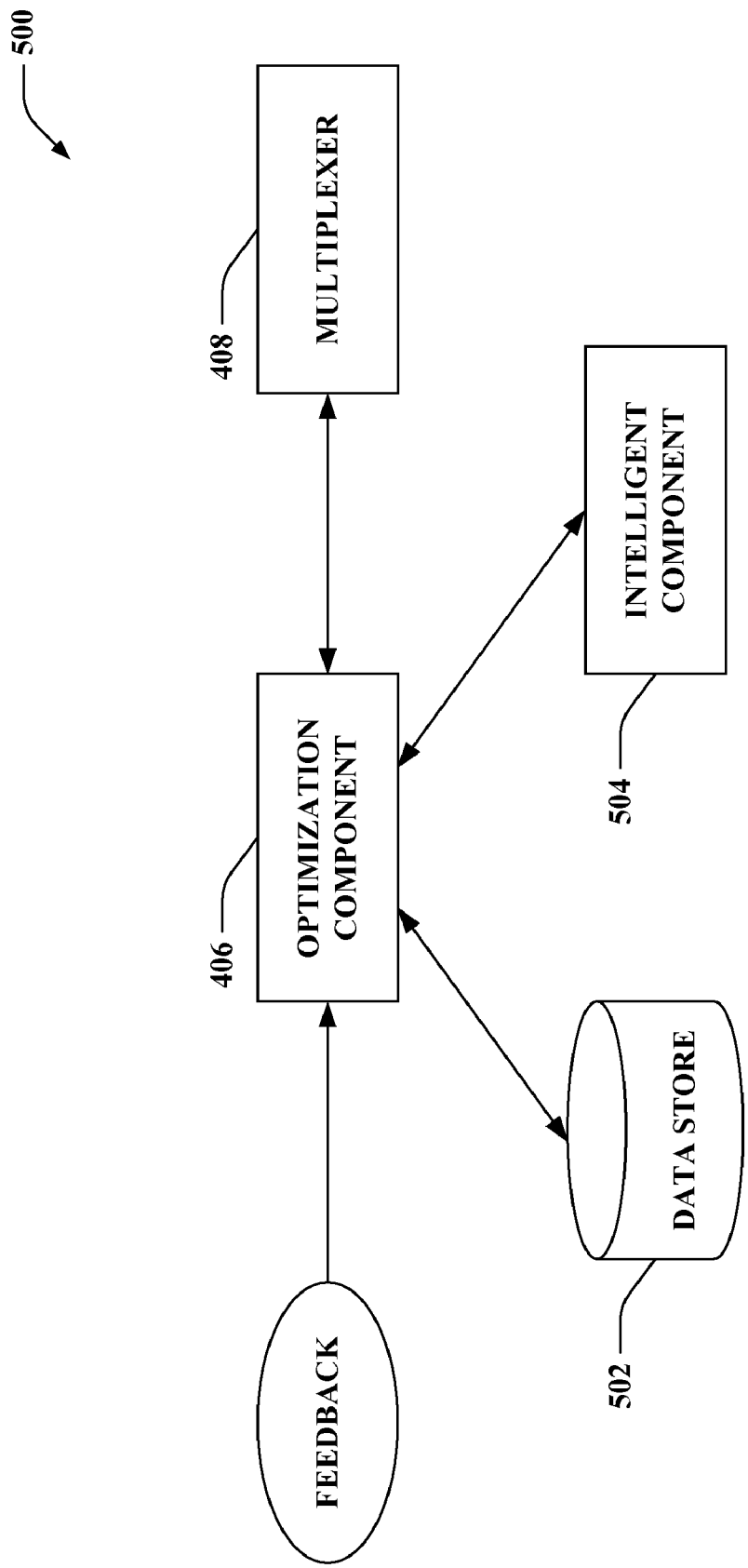
FIG. 5 illustrates a block diagram of an example system that enables optimizing selection of reference voltages for utilization by a programmable DAC.

Turning to FIG. 5, illustrated is a system 500 that enables optimizing selection of reference voltages for utilization by a programmable DAC. The system 500 includes the optimization component 406 and the multiplexer 408, which can be substantially similar to the aforementioned description. The optimization component 406 can further be coupled to a data store 502 and/or an intelligent component 504.

The data store 502 can retain historical data, trending data, feedback data, etc. that can be analyzed by the optimization component 406 in connection with controlling operation of the multiplexer 408. The data store 502 can be, for example, either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable programmable ROM (EEPROM), or flash memory. Volatile memory can include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM). The data store 502 of the subject systems and methods is intended to comprise, without being limited to, these and any other suitable types of memory. In addition, it is to be appreciated that the data store 502 can be a server, a database, a hard drive, and the like.

Further, the intelligent component 504 can be employed by the optimization component 406 to reason about whether to combine a subset of reference voltages for inputting to a particular programmable DAC. Pursuant to another example, the intelligent component 504 can infer whether kick-back noise is being transferred upstream (e.g., to a multi-tap voltage regulator, a low noise bandgap, . . . ).

It is to be understood that the intelligent component 504 can provide for reasoning about or infer states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification (explicitly and/or implicitly trained) schemes and/or systems (e.g. support vector machines, neural networks, expert systems, Bayesian belief networks, fuzzy logic, data fusion engines ...) can be employed in connection with performing automatic and/or inferred action in connection with the claimed subject matter.

A classifier is a function that maps an input attribute vector, x=(x1, x2, x3, x4, xn), to a confidence that the input belongs to a class, that is, f(x)=confidence(class). Such classification can employ a probabilistic and/or statistical-based analysis (e.g., factoring into the analysis utilities and costs) to prognose or infer an action that a user desires to be automatically performed. A support vector machine (SVM) is an example of a classifier that can be employed. The SVM operates by finding a hypersurface in the space of possible inputs, which hypersurface attempts to split the triggering criteria from the non-triggering events. Intuitively, this makes the classification correct for testing data that is near, but not identical to training data. Other directed and undirected model classification approaches include, e.g., naïve Bayes, Bayesian networks, decision trees, neural networks, fuzzy logic models, and probabilistic classification models providing different patterns of independence can be employed. Classification as used herein also is inclusive of statistical regression that is utilized to develop models of priority.

Figure 6:
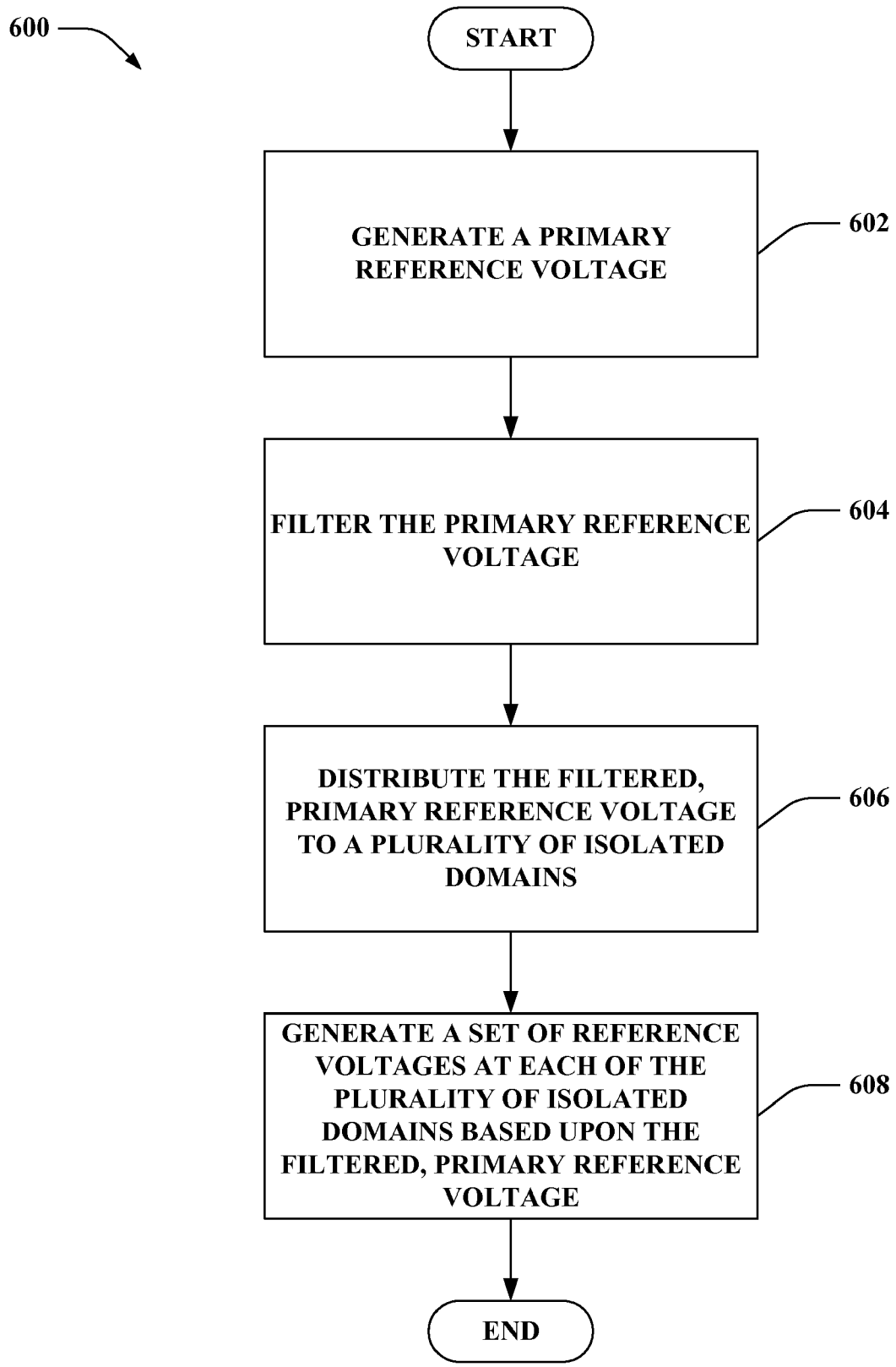
FIG. 6 illustrates an example methodology that facilitates generating and maintaining reference voltages for a CMOS iSoC sensor.
Figure 7:
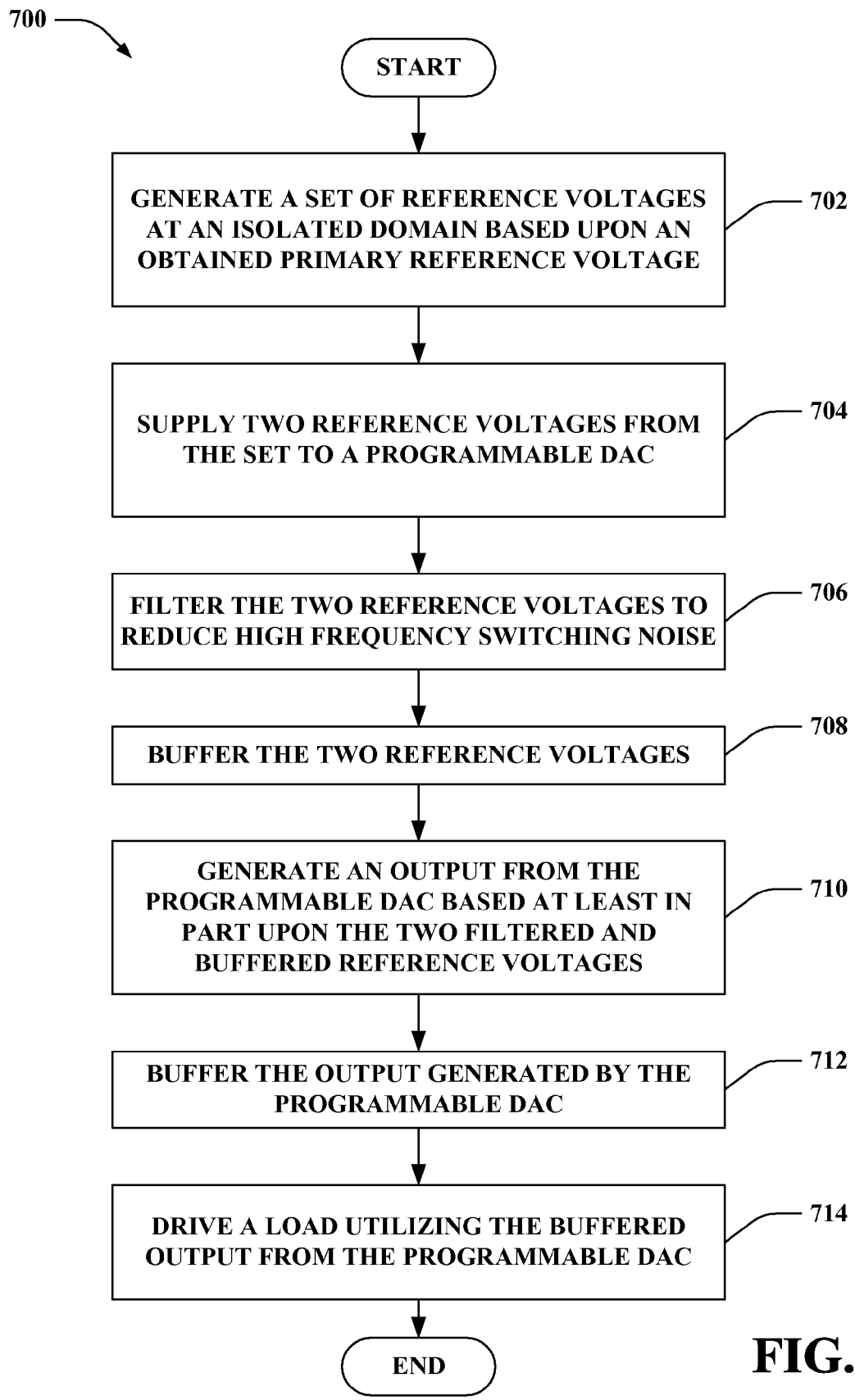
FIG. 7 illustrates an example methodology that facilitates driving an output load in a CMOS iSoC sensor.

FIGS. 6-7 illustrate methodologies in accordance with the claimed subject matter. For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts may be required to implement the methodologies in accordance with the claimed subject matter. In addition, those skilled in the art will understand and appreciate that the methodologies could alternatively be represented as a series of interrelated states via a state diagram or events.

Turning to FIG. 6, illustrated is a methodology 600 that facilitates generating and maintaining reference voltages for a CMOS iSoC sensor. At 602, a primary reference voltage can be generated. For instance, a low noise bandgap can yield the primary reference voltage. At 604, the primary reference voltage can be filtered. By way of illustration, high frequencies can be attenuated from the primary reference voltage (e.g., by utilizing a low pass filter). At 606, the filtered, primary reference voltage can be distributed to a plurality of isolated domains. Isolation techniques can also include time multiplexing switching techniques associated with local sampling of the references. It is contemplated that the filtered, primary reference voltage can be provided (e.g., via a star network configuration) to any number of domains. Moreover, the domains can include components that perform similar activities, operate in similar bandwidths, and so forth. According to an example, a first domain can relate to pixels (e.g. bandwidth less than 1 MHz), a second domain can relate to low speed read-outs (e.g., bandwidth between 1 MHz and 5 MHz), and a third domain can correspond to high speed read-outs (e.g., bandwidth above 10 MHz). The plurality of domains can be separated from one another to mitigate crosstalk between components included in each of the domains (e.g. reduce injection of kick-back noise injected upstream from components with disparate operating frequencies). Also, time multiplexing and sampling techniques can be used to further enhance the reference isolation. At 608, a set of reference voltages can be generated at each of the plurality of isolated domains based upon the filtered, primary reference voltage. These sets of reference voltages can thereafter be utilized by programmable digital to analog converters (DACs) in each of the domains.

Now referring to FIG. 7, illustrated is a methodology 700 that facilitates driving an output load in a CMOS iSoC sensor. At 702, a set of reference voltages can be generated at an isolated domain based upon an obtained primary reference voltage. For instance, upstream noise originating from the isolated domain traversing to the source of the primary reference voltage can be mitigated. At 704, two reference voltages from the set can be supplied to a programmable DAC. At 706, the two reference voltages can be filtered to reduce high frequency switching noise. For instance, the two reference voltages can be passively filtered. At 708, the two reference voltages can be buffered. Filtering and buffering of the reference voltages can be complementary such that the filtering attenuates signals outside of the bandwidth in which the buffering occurs. At 710, an output can be generated from the programmable DAC based at least in part upon the two filtered and buffered reference voltages. It is contemplated that an N bit programmable DAC can be utilized, where N can be substantially any integer. At 712, the output generated by the programmable DAC can be buffered. At 714, a load can be driven utilizing the buffered output from the programmable DAC. The buffered output can have a high slew rate, low impedance, and can provide sufficient load driving capabilities. Moreover, the load can be a capacitive load (e.g., switched capacitor). Further, characteristics of the load can be known a priori; however, the claimed subject matter is not so limited as it is contemplated that such characteristics can be time varying, unknown before operation, and the like.

Figure 8:
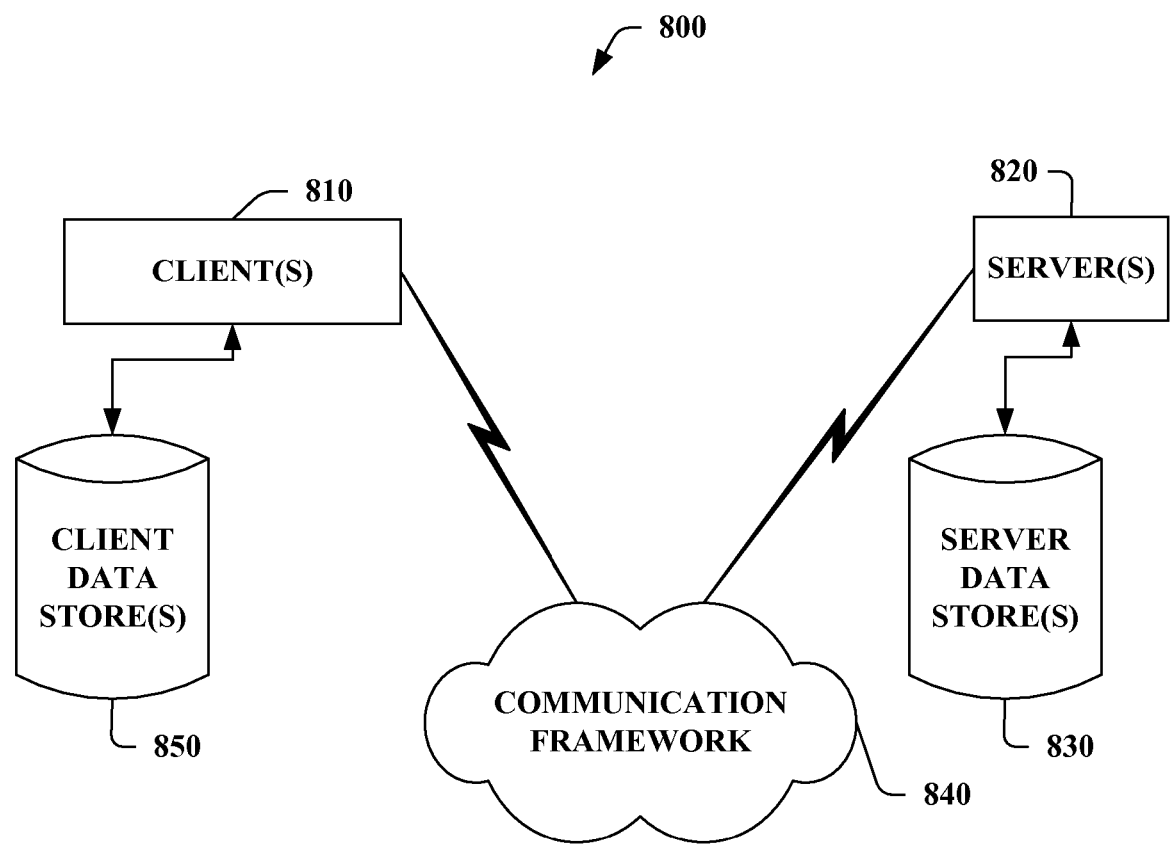
FIG. 8 illustrates an example networking environment, wherein the novel aspects of the claimed subject matter can be employed.
Figure 9:
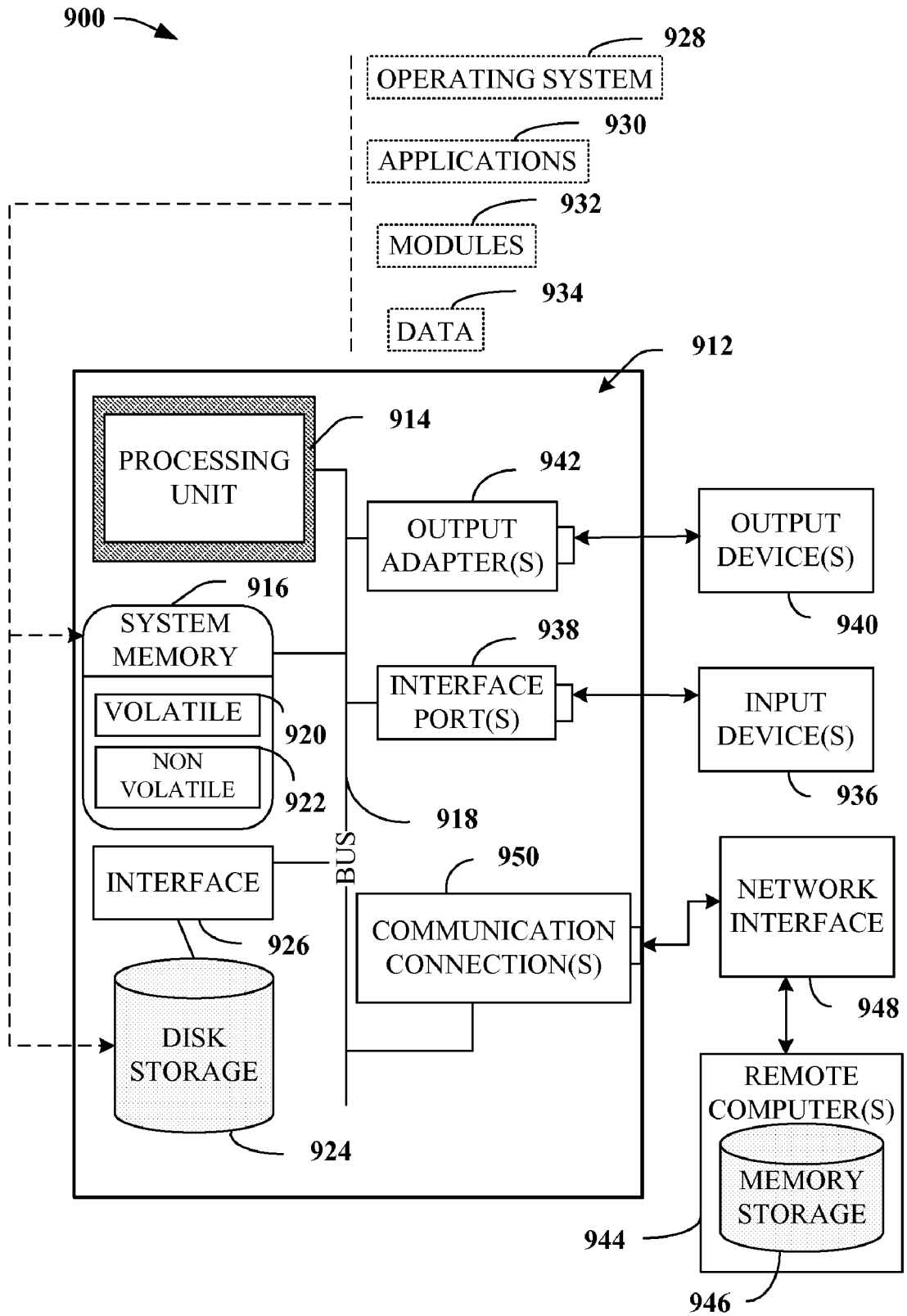
FIG. 9 illustrates an example operating environment that can be employed in accordance with the claimed subject matter.

In order to provide additional context for implementing various aspects of the claimed subject matter, FIGS. 8-9 and the following discussion is intended to provide a brief, general description of a suitable computing environment in which the various aspects of the subject innovation may be implemented. For instance, FIGS. 8-9 set forth a suitable computing environment that can be employed in connection with generating and/or maintaining reference voltages associated with CMOS sensor imagers. While the claimed subject matter has been described above in the general context of computer-executable instructions of a computer program that runs on a local computer and/or remote computer, those skilled in the art will recognize that the subject innovation also may be implemented in combination with other program modules. Generally, program modules include routines, programs, components, data structures, etc., that perform particular tasks and/or implement particular abstract data types.

Moreover, those skilled in the art will appreciate that the inventive methods may be practiced with other computer system configurations, including single-processor or multi-processor computer systems, minicomputers, mainframe computers, as well as personal computers, hand-held computing devices, microprocessor-based and/or programmable consumer electronics, and the like, each of which may operatively communicate with one or more associated devices. The illustrated aspects of the claimed subject matter may also be practiced in distributed computing environments where certain tasks are performed by remote processing devices that are linked through a communications network. However, some, if not all, aspects of the subject innovation may be practiced on stand-alone computers. In a distributed computing environment, program modules may be located in local and/or remote memory storage devices.

FIG. 8 is a schematic block diagram of a sample-computing environment 800 with which the claimed subject matter can interact. The system 800 includes one or more client(s) 810. The client(s) 810 can be hardware and/or software (e.g., threads, processes, computing devices). The system 800 also includes one or more server(s) 820. The server(s) 820 can be hardware and/or software (e.g., threads, processes, computing devices). The servers 820 can house threads to perform transformations by employing the subject innovation, for example.

One possible communication between a client 810 and a server 820 can be in the form of a data packet adapted to be transmitted between two or more computer processes. The system 800 includes a communication framework 840 that can be employed to facilitate communications between the client(s) 810 and the server(s) 820. The client(s) 810 are operably connected to one or more client data store(s) 850 that can be employed to store information local to the client(s) 810. Similarly, the server(s) 820 are operably connected to one or more server data store(s) 830 that can be employed to store information local to the servers 820.

With reference to FIG. 9, an exemplary environment 900 for implementing various aspects of the claimed subject matter includes a computer 912. The computer 912 includes a processing unit 914, a system memory 916, and a system bus 918. The system bus 918 couples system components including, but not limited to, the system memory 916 to the processing unit 914. The processing unit 914 can be any of various available processors. Dual microprocessors and other multiprocessor architectures also can be employed as the processing unit 914.

The system bus 918 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCM-CIA), Firewire (IEEE 1394), and Small Computer Systems Interface (SCSI).

The system memory 916 includes volatile memory 920 and nonvolatile memory 922. The basic input/output system (BIOS), containing the basic routines to transfer information between elements within the computer 912, such as during start-up, is stored in nonvolatile memory 922. By way of illustration, and not limitation, nonvolatile memory 922 can include read only memory (ROM), programmable ROM (PROM), electrically programmable ROM (EPROM), electrically erasable programmable ROM (EEPROM), or flash memory. Volatile memory 920 includes random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Computer 912 also includes removable/non-removable, volatile/non-volatile computer storage media. FIG. 9 illustrates, for example a disk storage 924. Disk storage 924 includes, but is not limited to, devices like a magnetic disk drive, floppy disk drive, tape drive, Jaz drive, Zip drive, LS-100 drive, flash memory card, or memory stick. In addition, disk storage 924 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 924 to the system bus 918, a removable or non-removable interface is typically used such as interface 926.

It is to be appreciated that FIG. 9 describes software that acts as an intermediary between users and the basic computer resources described in the suitable operating environment 900. Such software includes an operating system 928. Operating system 928, which can be stored on disk storage 924, acts to control and allocate resources of the computer system 912. System applications 930 take advantage of the management of resources by operating system 928 through program modules 932 and program data 934 stored either in system memory 916 or on disk storage 924. It is to be appreciated that the claimed subject matter can be implemented with various operating systems or combinations of operating systems.

A user enters commands or information into the computer 912 through input device(s) 936. Input devices 936 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 914 through the system bus 918 via interface port(s) 938. Interface port(s) 938 include, for example, a serial port, a parallel port, a game port, and a universal serial bus (USB). Output device(s) 940 use some of the same type of ports as input device(s) 936. Thus, for example, a USB port may be used to provide input to computer 912, and to output information from computer 912 to an output device 940. Output adapter 942 is provided to illustrate that there are some output devices 940 like monitors, speakers, and printers, among other output devices 940, which require special adapters. The output adapters 942 include, by way of illustration and not limitation, video and sound cards that provide a means of connection between the output device 940 and the system bus 918. It should be noted that other devices and/or systems of devices provide both input and output capabilities such as remote computer(s) 944.

Computer 912 can operate in a networked environment using logical connections to one or more remote computers, such as remote computer(s) 944. The remote computer(s) 944 can be a personal computer, a server, a router, a network PC, a workstation, a microprocessor based appliance, a peer device or other common network node and the like, and typically includes many or all of the elements described relative to computer 912. For purposes of brevity, only a memory storage device 946 is illustrated with remote computer(s) 944. Remote computer(s) 944 is logically connected to computer 912 through a network interface 948 and then physically connected via communication connection 950. Network interface 948 encompasses wire and/or wireless communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 950 refers to the hardware/software employed to connect the network interface 948 to the bus 918. While communication connection 950 is shown for illustrative clarity inside computer 912, it can also be external to computer 912. The hardware/software necessary for connection to the network interface 948 includes, for exemplary purposes only, internal and external technologies such as, modems including regular telephone grade modems, cable modems and DSL modems, ISDN adapters, and Ethernet cards.

What has been described above includes examples of the subject innovation. It is, of course, not possible to describe every conceivable combination of components or methodologies for purposes of describing the claimed subject matter, but one of ordinary skill in the art may recognize that many further combinations and permutations of the subject innovation are possible. Accordingly, the claimed subject matter is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the claimed subject matter. In this regard, it will also be recognized that the innovation includes a system as well as a computer-readable medium having computer-executable instructions for performing the acts and/or events of the various methods of the claimed subject matter.

In addition, while a particular feature of the subject innovation may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

What is claimed is:

1. A system that generates low noise reference voltages for a complementary metal-oxide-semiconductor (CMOS) imaging system-on-chip (iSoC) sensor, comprising:
    a low noise bandgap that generates a primary reference voltage;
    a low pass filter that filters the primary reference voltage from the low noise bandgap; and
    a network that distributes the filtered, primary reference voltage to at least three isolated domains including a first domain of programmable digital to analog converters (DACs) for pixels, a second domain of programmable DACs for low speed read-out, and a third domain of programmable DACs for high-speed read-out, at least one of the three isolated domains further comprises:
        a multi-tap voltage regulator that generates a set of reference voltages independent of reference voltages yielded in disparate domains from the filtered, primary reference voltage;
        a programmable DAC that employs a subset of the set of reference voltages for yielding an output to provide to a corresponding load; and
        a multiplexer that dynamically switches the subset of reference voltages for the programmable DAC.

2. The system of claim 1, each of the three isolated domains serves respective circuits that support common activities and frequencies of activities.

3. The system of claim 1, the first domain of programmable DACs for pixels supports frequencies less than 1 MHz, the second domain of programmable DACs for low speed read-out supports frequencies between 1 MHz and 5 MHz, and the third domain of programmable DACs for high speed read-out supports frequencies above 10 MHz.

4. The system of claim 1, the three isolated domains being separated from each other to mitigate cross-talk resulting from switching effects that traverses between the three isolated domains.

5. The system of claim 1, the programmable DAC further comprises:
    filters that passively filter each of the reference voltages in the subset employed by the programmable DAC; and
    local buffers that buffer each of the reference voltages in the subset employed by the programmable DAC.

6. The system of claim 5, further comprising an output buffer that separates the programmable DAC from the corresponding load.

7. The system of claim 6, the output buffer has a high slew rate and low impedance for current driving.

8. The system of claim 5, the filters limit signal path bandwidths to frequencies lower than dominant poles of the local buffers to attenuate out-of-band noise.

9. The system of claim 1, the corresponding load being a switched capacitor.

10. The system of claim 1, further comprising:
    an optimization component that obtains feedback from the programmable DAC and the multiplexer to adjust operation of the multiplexer.

11. A method that facilitates driving an output load in a complementary metal-oxide-semiconductor (CMOS) imaging system-on-chip (iSoC) sensor, comprising:
    generating a set of reference voltages at an isolated domain based upon an obtained primary reference voltage;
    supplying two reference voltages from the set to a programmable digital to analog converter (DAC);
    dynamically switching the two reference voltages supplied to the programmable DAC;
    filtering the two reference voltages to reduce high frequency switching noise;
    buffering the two reference voltages;
    generating an output from the programmable DAC based at least in part upon the two filtered and buffered reference voltages;
    buffering the output generated by the programmable DAC; and
    driving a load utilizing the buffered output from the programmable DAC.

12. The method of claim 11, further comprising receiving the primary reference voltage.

13. The method of claim 12, receiving the primary reference voltage further comprises:
    generating the primary reference voltage;

filtering the primary reference voltage to attenuate high frequencies; and distributing the filtered, primary reference voltage to a plurality of isolated domains.

14. The method of claim 13, the plurality of isolated domains comprises a first domain of programmable DACs for pixels, a second domain of programmable DACs for low speed read-out, and a third domain of programmable DACs for high-speed read-out.

15. The method of claim 14, the first domain, second domain and third domain being separated from each other to mitigate cross-talk resulting from switching effects that traverses between the three isolated domains.

16. The method of claim 11, filtering the two reference voltages to attenuate frequencies outside of bandwidths at which buffering of the two reference voltages occurs.

17. The method of claim 11, further comprising separating the load from the programmable DAC by buffering the output from the programmable DAC to provide a high slew rate and low impedance for current driving.

18. A system that enables generating and maintaining reference voltages for a complementary metal-oxide-semiconductor (CMOS) imaging system-on-chip (iSoC) sensor, comprising:

means for generating a primary reference voltage;

means for filtering the primary reference voltage;

means for distributing the filtered, primary reference voltage to a plurality of isolated domains;

means for generating a set of reference voltages at each of the plurality of isolated domains based upon the filtered, primary reference voltage;

means for supplying two reference voltages from the set of reference voltages to a programmable digital to analog converter (DAC) at a particular isolated domain;

means for dynamically switching the two reference voltages supplied to the programmable DAC;

means for filtering the two reference voltages to reduce high frequency switching noise;

means for buffering the two reference voltages;

means for generating an output from the programmable DAC based at least in part upon the two filtered and buffered reference voltages;

means for buffering the output generated by the programmable DAC; and means for driving a load utilizing the buffered output from the programmable DAC.

* * * * *